(12) United States Patent
Geh et al.

(10) Patent No.: US 7,301,622 B2
(45) Date of Patent: Nov. 27, 2007

(54) METHOD FOR OPTIMIZING THE IMAGE PROPERTIES OF AT LEAST TWO OPTICAL ELEMENTS AS WELL AS METHODS FOR OPTIMIZING THE IMAGE PROPERTIES OF AT LEAST THREE OPTICAL ELEMENTS

(75) Inventors: Bernd Geh, Aalen (DE); Paul Gräupner, Aalen (DE); Thomas Stammler, Aalen (DE); Dirk Stenkamp, Essingen (DE); Jochen Stühler, Aalen (DE); Klaus Wurmbrand, Hüttlingen (DE)

(73) Assignee: Carl Zeiss SMT AG, Oberkochen (DE)

( * ) Notice: Subject to any disclaimer, the term of this patent is extended or adjusted under 35 U.S.C. 154(b) by 48 days.

(21) Appl. No.: 11/187,730

(22) Filed: Jul. 22, 2005

(65) Prior Publication Data

US 2005/0254042 A1    Nov. 17, 2005

Related U.S. Application Data

(63) Continuation of application No. 10/697,811, filed on Oct. 30, 2003, now Pat. No. 6,934,011, which is a continuation of application No. 10/247,270, filed on Sep. 19, 2002, now Pat. No. 6,678,240.

(30) Foreign Application Priority Data

Sep. 21, 2001    (DE) .................. 101 46 499

(51) Int. Cl.
  *G03B 27/32* (2006.01)
(52) U.S. Cl. .................... 356/239.2; 355/77
(58) Field of Classification Search ............ None
  See application file for complete search history.

(56) References Cited

U.S. PATENT DOCUMENTS 3,785,713 A    1/1974    Walles (Continued)

FOREIGN PATENT DOCUMENTS

DE    195 16 017    9/1996

(Continued)

OTHER PUBLICATIONS

Hiroshi Fukada, "Determination of high-order lens aberration using phase/amplitude linear algegra," J. Vac. Sci. Technol. B 17(6), Nov./Dec. 1999, pp. 3318-3321.

*Primary Examiner*—Gregory J. Toatley, Jr.
*Assistant Examiner*—Juan D. Valentin, II
(74) *Attorney, Agent, or Firm*—Factor & Lake, Ltd.

(57) ABSTRACT

In order to optimize the image properties of several optical elements of which at least one is moved relative to at least one stationary optical element, the overall image defect resulting from the interaction of all optical elements is first of all measured. This is represented as a linear combination of the base functions of an orthogonal function set. The movable element is then moved to a new measurement position and the overall image defect is measured once again. After the linear combination representation of the new overall image defect, the image defects of the movable element and of the stationary element are calculated from the data thereby obtained. With only one movable optical element a target position in which the overall image defect is minimized can be directly calculated and adjusted there from. If several movable optical elements are available, methods are given for the efficient determination of the respective target position.

18 Claims, 7 Drawing Sheets

U.S. PATENT DOCUMENTS

| | | | |
|---|---|---|---|
| 4,110,046 A * | 8/1978 | Baker et al. ................. 356/124 |
| 4,208,101 A | 6/1980 | Trapp et al. |
| 4,629,313 A | 12/1986 | Tanimoto |
| 4,668,077 A | 5/1987 | Tanaka |
| 4,953,962 A | 9/1990 | Esswein et al. |
| 4,976,525 A | 12/1990 | Matsumura et al. |
| 5,111,325 A | 5/1992 | DeJager |
| 5,212,597 A | 5/1993 | Yamada |
| 5,339,193 A | 8/1994 | Korpert et al. |
| 5,384,573 A | 1/1995 | Turpin |
| 5,561,562 A | 10/1996 | Bender |
| 5,717,781 A | 2/1998 | Ebel et al. |
| 5,742,381 A * | 4/1998 | Ueno ......................... 356/124 |
| 5,825,476 A | 10/1998 | Abitol et al. |
| 5,828,500 A | 10/1998 | Kida et al. |
| 5,835,207 A | 11/1998 | Sugiura et al. |
| 5,835,280 A | 11/1998 | Griffith |
| 5,847,822 A | 12/1998 | Sugiura et al. |
| 5,852,518 A | 12/1998 | Hatasawa et al. |
| 5,854,674 A | 12/1998 | Lin |
| 5,995,292 A | 11/1999 | McDonald |
| 6,034,766 A | 3/2000 | Sugiura et al. |
| 6,208,475 B1 * | 3/2001 | Yamamoto et al. ...... 356/239.2 |
| 6,256,086 B1 | 7/2001 | Sumiyoshi |
| 6,452,145 B1 * | 9/2002 | Graves et al. ............... 356/121 |
| 6,476,400 B1 | 11/2002 | Robinson et al. |
| 6,496,253 B1 | 12/2002 | Vokhmin |
| 6,496,257 B1 * | 12/2002 | Taniguchi et al. ........ 356/239.2 |
| 6,522,392 B1 | 2/2003 | Muller-Rissmann et al. |
| 6,687,396 B1 | 2/2004 | Sugiura et al. |
| 6,693,704 B1 * | 2/2004 | Ooki et al. ................. 356/124 |
| 2001/0006412 A1 | 7/2001 | Karl-Heinz et al. |
| 2002/0008869 A1 | 1/2002 | Van der Laan et al. |
| 2002/0012107 A1 | 1/2002 | Suzuki |

FOREIGN PATENT DOCUMENTS

| | | |
|---|---|---|
| EP | 0 992 853 | 4/2000 |
| EP | 1 128 217 A2 | 8/2001 |
| EP | 1 128 218 A | 8/2001 |
| JP | 10154657 A | 6/1998 |
| JP | 2000121491 A | 4/2000 |

* cited by examiner

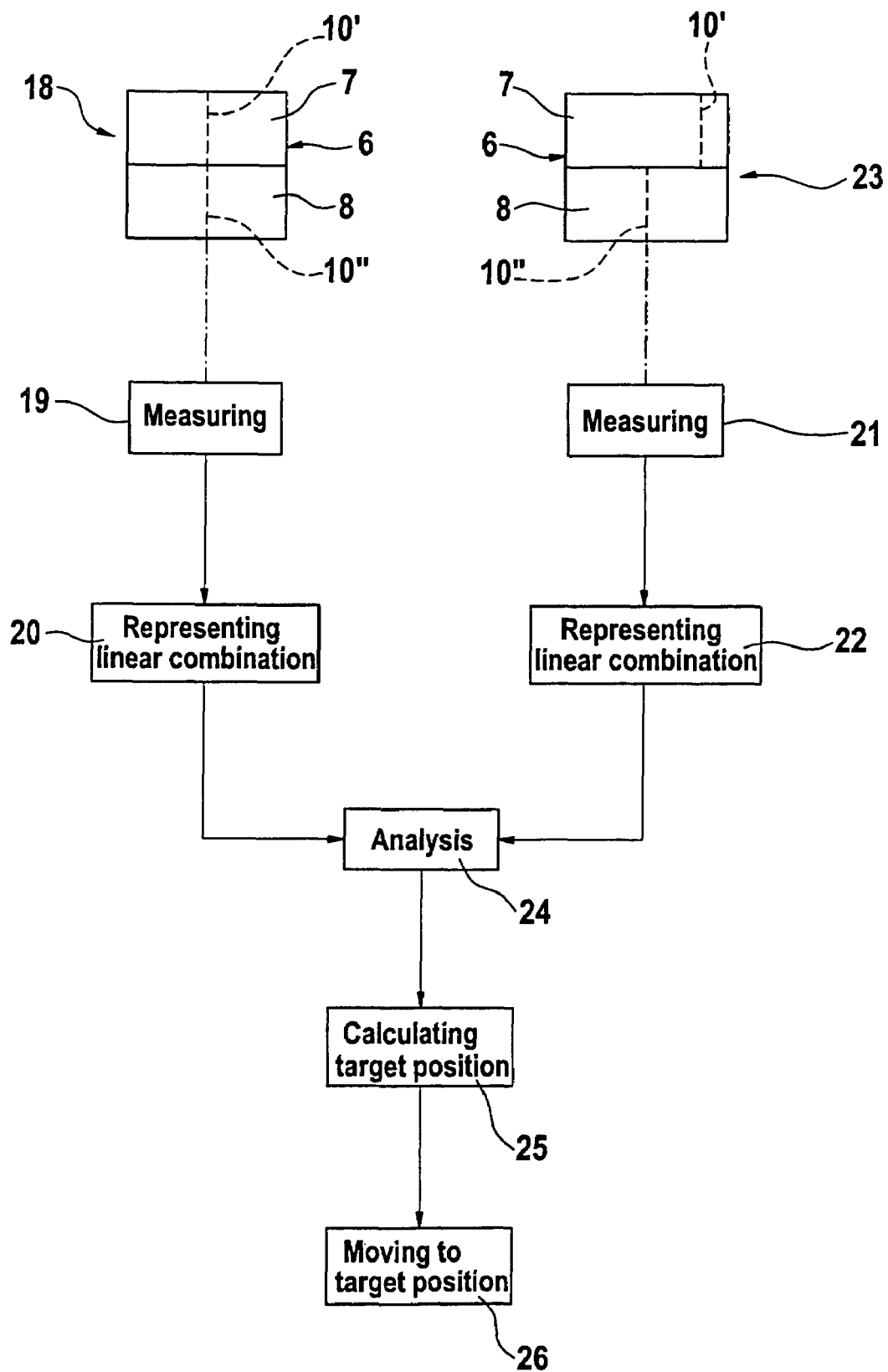

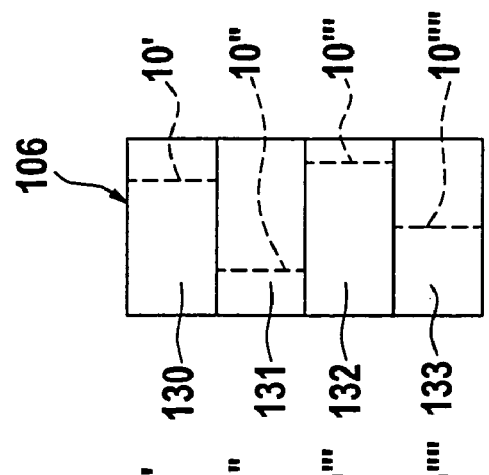
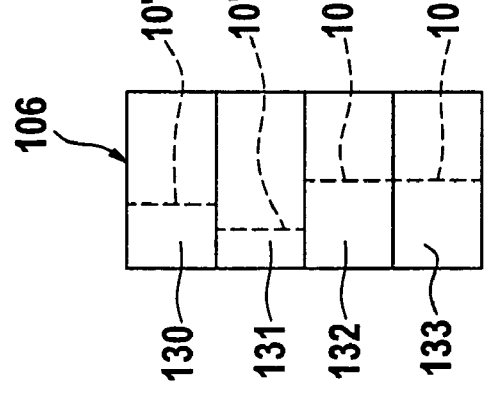
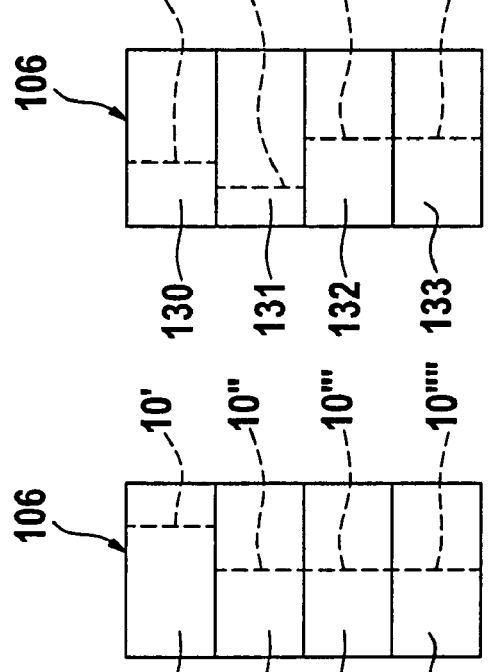
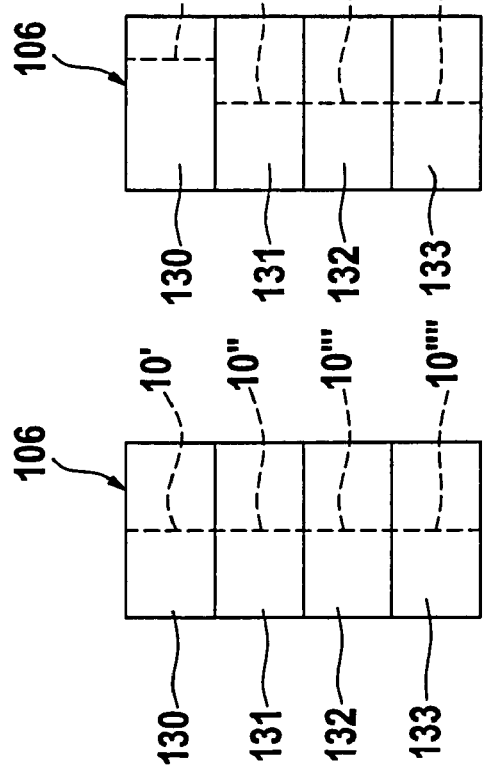

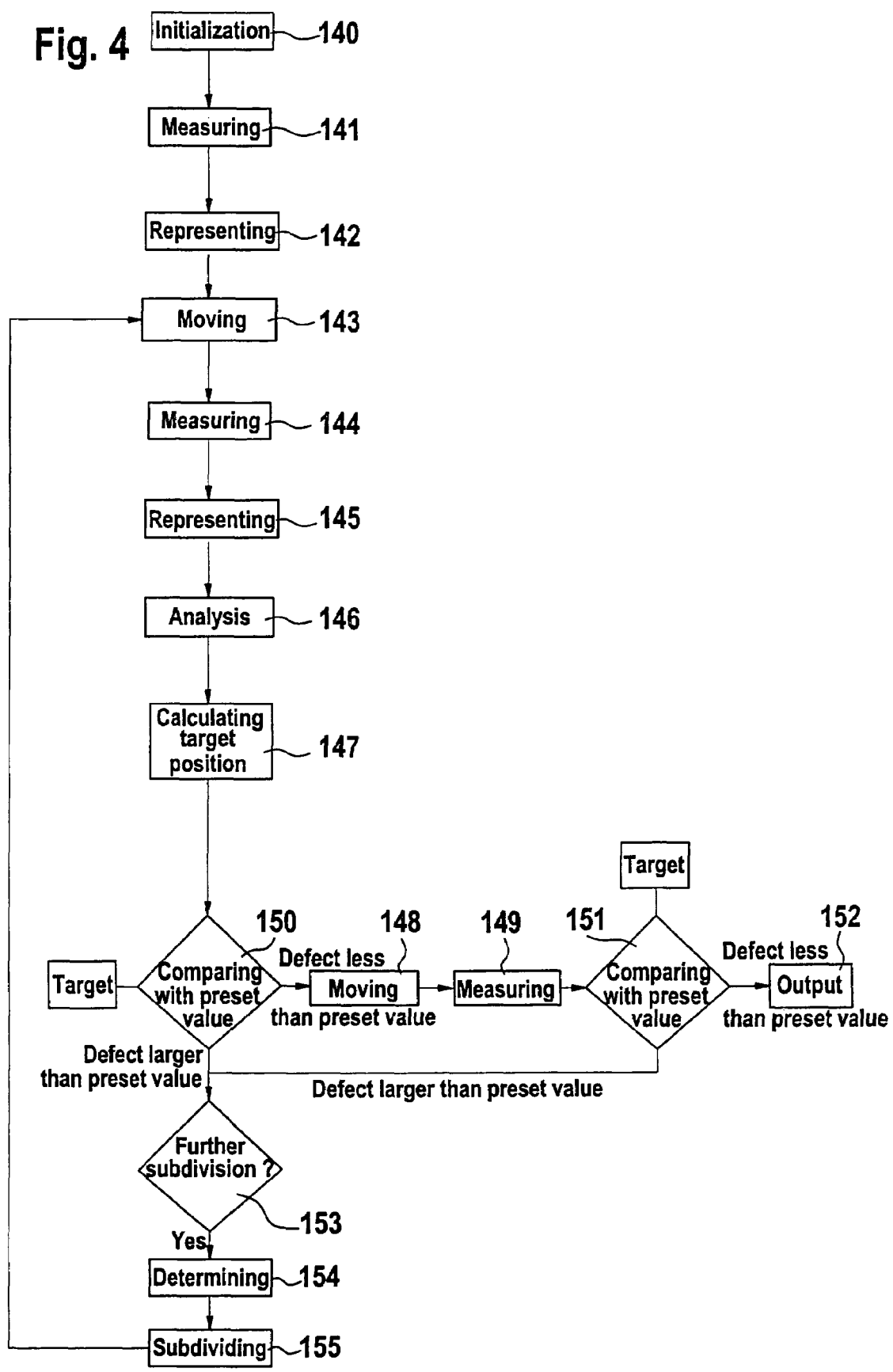

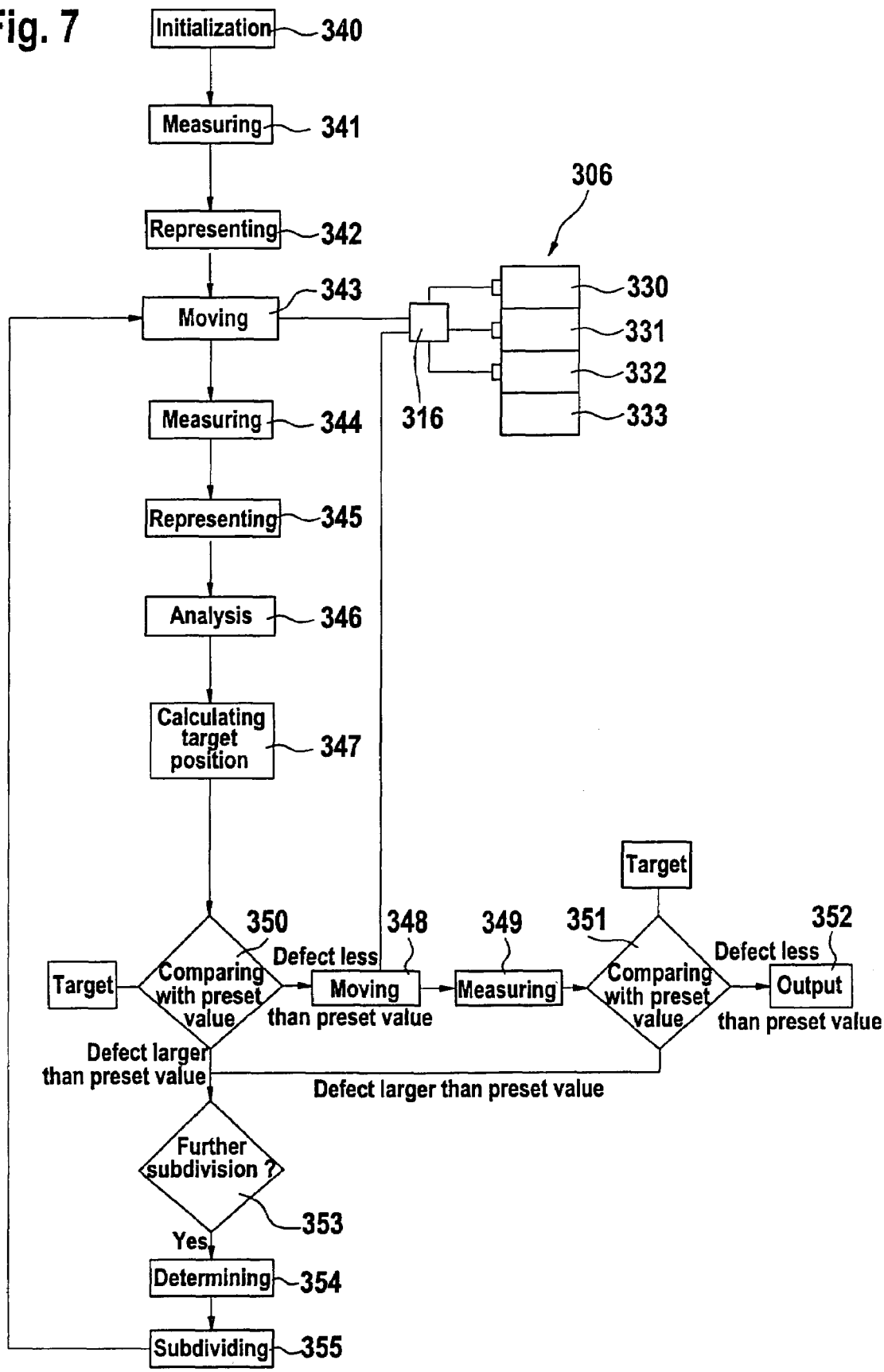

METHOD FOR OPTIMIZING THE IMAGE PROPERTIES OF AT LEAST TWO OPTICAL ELEMENTS AS WELL AS METHODS FOR OPTIMIZING THE IMAGE PROPERTIES OF AT LEAST THREE OPTICAL ELEMENTS

CROSS-REFERENCE TO RELATED APPLICATIONS

This application is a continuation of U.S. application Ser. No. 10/697,811, filed in the United States on Oct. 20, 2003 now U.S. Pat. No. 6,934,011 which is a continuation of U.S. application Ser. No. 10/247,270 filed in the United States on Sep. 19, 2002, now U.S. Pat. No. 6,678,240 which claims priority to German Patent Application No. 101 46 499.1 having a filing date of Sep. 21, 2001.

FIELD OF THE INVENTION

The present invention relates to a method for optimizing the image properties of at least two optical elements, in which at least one of the optical elements is moved relative to at least one stationary optical element.

DESCRIPTION OF RELATED ART

The invention also relates to methods for optimizing the image properties of at least three optical elements, in which the relative position of the optical elements with respect to one another is adjusted.

Optical assemblies comprising at least one movable optical element are known on the market, and include projection objective lens systems for microlithography. With these, but also with other optical assemblies, a high image quality is required in order to produce a picture of a structure that is as free of defects as possible. The movability of at least one optical element within such a projection objective lens system serves to vary the image properties of the projection objective lens system with the aim of reducing the occurring image defects.

The choice of the position to which a moveable optical element should be adjusted so that the image defect of the optical assembly is thereby minimized, has hitherto often been made by individual measurement of the image properties of the optical elements before they are assembled. Since many image defects are produced only during assembly, for example as a result of pressure influences of the holders for the optical elements, such an approach to achieving a high image quality is too inaccurate.

Other approaches, in which the positioning of the optical elements is optimized on the basis of readily visualisable target quantities reproducing, though only incompletely, the image quality and that have been obtained from the interaction of the optical elements, rely on the experience of the technician entrusted with the adjustment of the assembly to find the most favorable rotational position. Such optimization methods are insufficiently deterministic.

A method that necessarily leads to the optimum relative position between the moveable and the stationary optical element takes measurements of the image defects of the optical assemblies, including both the moveable and the stationary optical elements, at all achievable positions of the movable optical element. This procedure is too tedious and complicated since as a rule a plurality of achievable positions exists for the accurate positioning of the movable optical element.

In the search for possible ways of improving projection objective lens systems in order to satisfy increasingly stringent requirements as regards image quality, projection objective lens systems have been proposed in which movable optical components can be arranged at various positions within the projection objective lens system. In this connection the number of movable optical components is not limited to one; instead there may often be several movable optical elements within the projection objective lens system.

With such projection objective lens systems the question arises, at which position should a movable optical element be provided within the projection objective lens system in order to be able to correct a specific image defect, and how many optical elements may optionally have to be moved for this purpose. In addition there is the question, what degree of freedom of movement can be employed in order to correct a specific image defect. Such degrees of freedom of movement include the rotation of optical elements within the projection objective lens system, the displacement of optical elements along the optical axis of the projection objective lens system (focusing) and vertical thereto (centering), and the tilting of optical elements within the projection objective lens system.

Overall there exists a plurality of degrees of freedom that are in principle available for correcting image defects within a projection objective lens system.

With the previously known optical assemblies a choice of the degrees of freedom that were employed for correcting image defects was made on the basis of trial-and-error methods. In the same way as when finding the most favorable rotational position, here too the experience of the respective technician was decisive in finding useful degrees of freedom, which however led to adjustment results that were not deterministically reproducible. Often the choice of the lenses to be moved as well as the choice of the degrees of freedom of movement were very time-consuming and also did not always achieve predefined specifications.

Also in those cases in which it is in principle known which lenses within a projection objective lens system have to be moved in order to correct specific image defects, as a rule a multidimensional problem still always exists with a mobility of several lenses within a projection objective lens system, with the result that an optimal position configuration of all movable lenses in which the overall image defect falls below predetermined specifications and/or reaches an absolute minimum often cannot be found with reasonable effort and expenditure.

A first object of the present invention is accordingly to provide a method for optimizing the image properties of at least two optical elements, in which at least one of the optical elements is moved relative to at least one stationary optical element, by means of which the overall image defect of the at least two optical elements can be specifically reduced with comparably little effort.

This object is achieved according to the invention by a method involving the following procedural steps:

a) measurement of the overall image defect of all optical elements, consisting of the image defect of the movable optical element and the image defect of the stationary optical element, in which all optical elements are traversed by measuring light;

b) representation of the measured overall image defect as a linear combination of the base functions of an orthogonal function set;

c) movement of the movable optical element relative to the stationary optical element to a new measurement position;

d) renewed measurement of the new overall image defect of all optical elements, consisting of the image defect of the movable element and the image defect of the stationary optical element, in which all optical elements are traversed by measuring light;

e) representation of the new overall image defect as a linear combination of the base functions of an orthogonal function set;

f) calculation of the image defect of the movable optical element and calculation of the image defect of the stationary optical element, using the representations obtained in steps b) and e);

g) calculation of a target position of the movable optical element from its image defect and from the image defect of the stationary optical element, in which the overall image defect is minimized;

h) movement of the movable optical element to the target position.

The method according to the invention first of all determines in situ the image defect contributions of the movable and of the stationary optical elements. This determination utilizes the fact that, in the representation of the overall image defect as a linear combination of the base functions of an orthogonal function set, the overall image defect of the movable and of the stationary optical elements both before as well as after the movement of the movable optical element consists, in a well defined manner, of the individual contributions of the image defects of the movable and of the stationary optical elements. Accordingly conclusions can be drawn as regards the separate image defects of the movable and of the stationary optical elements from two measurements of the overall image defect, namely before and after a movement of the movable optical element. The separate image defects determined in this way may then be used to calculate a target position, i.e. a position of the movable optical element relative to the stationary optical element in which the overall image defect of the optical elements is minimized.

By means of this method the position configuration with the least overall image defect and/or with an overall image defect lying below a specified value is achieved in a deterministic manner, in which no externally determined image quantities but exclusively quantities measured in situ are used. The method can accordingly be automated. Since the method is in principle satisfactorily performed with two measurement steps, it can be carried out relatively quickly and could in principle also be used to take account of varying image properties of the optical elements. In this case the method would be repeated from time to time.

A further object of the invention is to provide methods for optimizing the image properties of at least three optical elements, in which the relative position of the optical elements with respect to one another is adjusted, and by means of which the overall image defect of the optical elements can be specifically minimized with comparatively little effort.

This object is achieved according to the invention by a first method involving the following procedural steps:

a) measurement of the overall image defect of all optical elements, consisting of the image defect of the movable elements and the image defect of the stationary optical element, in which all optical elements are traversed by measuring light;

b) representation of the measured overall image defect as a linear combination of the base functions of an orthogonal function set;

c) movement of one or more of the movable optical elements jointly to a new measurement position;

d) renewed measurement of the overall image defect of the optical elements, consisting of the image defect of the one moved element or of the jointly moved optical elements, and the image defect of the remaining optical elements, in which all optical elements are traversed by measuring light;

e) representation of the new overall image defect as a linear combination of the base functions of an orthogonal function set;

f) calculation of the image defects of the one moved optical element or of the jointly moved optical elements and of the image defect of the remaining optical elements, using the representations obtained in steps b) and e);

g) repetition of the procedural steps c) to f) for one other or several others of the optical elements, until each movable optical element has been moved at least once relative to the closest adjacent optical element or elements;

h) calculation of a target position of the movable optical elements from the image defects of the individual movable optical elements and the at least one stationary optical element, in which the overall image defect is minimized;

i) movement of the movable optical elements to the calculated target position.

With this method the basic principle of the first method according to the invention is developed further in that first of all the separate image defects of all optical elements movable with respect to one another are determined. Then on the basis of the calculated separate image defects of the optical elements that are movable with respect to one another, a target position of the movable optical elements is determined, in which the overall image defect is minimized. Since on account of the representation of the image defects as a linear combination of the base functions of an orthogonal function set the change of the overall image defect as a consequence of the movement of the movable optical elements can be calculated, it is not necessary actually to achieve all possible relative positions of the movable elements in order to optimize the projection objective lens system. Instead, it is sufficient to move each movable optical element at least once relative to the optical elements adjacent thereto. This significantly reduces the number of required movement steps and thus the effort involved in determining a position configuration with optimized image properties. After the determination of the individual image defects, the determination of the target position is a deterministic computational task, which means that only the target position needs to be adjusted.

When calculating the target position either all position combinations of the optical elements movable with respect to one another can be investigated in an imaginary manner, i.e. not by real relative movement but by calculation, and in this way the global minimum of the overall image defect can be determined. Alternatively a statistical procedure can be adopted, in which randomly determined position combinations are tested, and in this way an approximation to the global minimum becomes possible without having to calculate each possible position combination. A statistical procedure that may be used for this purpose can be obtained by transferring a problem from statistical mechanics, namely the determination of the state of a physical multiparticle system in thermal equilibrium. This considerably reduces the computational effort involved in the calculation of the target position.

The last mentioned task is achieved according to the invention by a second method involving the following procedural steps:

a) subdivision of the at least three optical elements into a first part to be moved, and a second, stationary part;
b) measurement of the overall image defect of all optical elements in an initial position, in which all optical elements are traversed by measuring light;
c) representation of the measured image defect as a linear combination of the base functions of an orthogonal function set;
d) movement of the part of the optical elements to be moved, to a new measurement position;
e) renewed measurement of the new overall image defect of all optical elements in the new measurement position, in which the optical elements are traversed by measuring light;
f) representation of the new overall image defect as a linear combination of the base functions of an orthogonal function set;
g) calculation of the image defect of the moved part of the optical elements and of the image defect of the stationary part of the optical elements, using the representation obtained in steps c) and f);
h) calculation of a target position of the moved part or of the previously moved parts of the optical elements, in which the overall image defect is minimised, from the calculated image defects of the moved part and of the stationary part of the optical elements;
i) comparison of the determined overall image defect in the calculated target position with a preset value;
j) if the overall image defect is greater than the preset value and there still exists at least one part of the optical elements already measured with regard to the image defect after the steps a) to g), together with at least two optical elements movable with respect to one another:
  ja) determination of that part of the optical elements already measured with regard to the image defect after the steps a) to g) that still consists of at least two optical elements movable relative to one another and exhibits the largest image defect;
  jb) subdivision of the determined part of the optical elements into a next part of the optical elements to be moved and into a next stationary part;
  jc) repetition of the procedural steps d) to i) for the next part to be moved;
  jd) if no subdivisible part according to step jb) exists any longer, the overall image defect is issued and the adjustment procedure is terminated;
k) if the overall image defect is less than the preset value, the moved part or the previously moved parts are moved to the target position calculated in step h) unless this has already occurred within the scope of step i).

With this method it is ensured that a subdivision into movable and stationary parts of the optical elements is carried out only until a predetermined specification of the overall image defect is achieved. In practice initially those parts may be predetermined as movable that according to experience provide the largest image defect contribution. Only if a correction of the overall image defect does not produce the desired effect through the movement of these parts are new subdivisions automatically carried out. This considerably reduces the effort involved in determining the optimized position configuration.

In order to calculate the target position, alternatively all position combinations of the previously moved parts may be reinvestigated and the global minimum may be sought, or instead a statistical procedure as mentioned above may be adopted.

The determination of the new overall image defect before the comparison with the preset value in procedural step i) may comprise the following steps:

a) movement of the moved part of the optical elements to the calculated target position;
b) measurement of the new overall image defect of all optical elements in the target position.

With this modification the calculated target position is monitored as regards the overall image defect by an actual, and thus not only an imaginary, movement of the optical elements to the target position. If there are variations between the calculated and the measured overall image defect in the target position, then a determination of the image defects of the individual previously moved optical elements may optionally be carried out once more.

Alternatively, the overall image defect may be determined before the comparison with the preset value in procedural step i):

Calculation of the new overall image defect of all optical elements in the target position from the calculated image defects of the moved and of the stationary part of the optical elements.

In this case the movement to target positions is omitted so long as it is still not clear whether the overall image defect lies within the specified value. This speeds up the method.

The at least one moveable optical element may be rotatable about the optical axis. By rotating optical elements, non-rotationally symmetrical image defects of optical elements movable with respect to one another can be mutually compensated. In principle the methods according to the invention can also be used to correct image properties by means of other degrees of freedom of movement of the moveable optical elements.

Air image data may be used for the measurement of the overall image defect. Such data based on an intensity measurement in the region of the image plane of the optical element or a plane conjugate thereto may be obtained relatively easily.

An accurate description of the overall image defect is then possible if, for the measurement of the overall image defect, the wave front data of an image bundle are measured after the projection objective lens system. Such an accurate description of the overall image defect ensures a unique allocation of individual defect contributions, which in many cases is a precondition for minimizing the overall image defect within the framework of the optimization method.

The air image data may be measured at various illumination settings. Air image measurements can be carried out with relatively little effort, but as a rule provide unequivocal information only with regard to the azimuthal variation of the overall image defect. If an overall image defect obtained by an air image measurement is matched by means of a linear combination of orthogonal functions, then the problem arises that the radial variations of the overall image defect cannot be matched unequivocally since the accuracy of the air image measurements is as a rule not sufficient for this purpose. If air image data are collected at different illumination settings, then wave front data that are sufficiently accurate for the allocation of individual error contributions can also be obtained via air image measurements. The implementation of more complicated measurement methods, in particular interferometry measurements, in order to determine the wave front data can thus be dispensed with.

Zernike functions may be chosen as orthogonal function set. Zernike functions are routinely used to describe typical image defects, for example Seidel aberrations. The Zernike coefficients may often be allocated directly to a specific image defect, which is why a factorization according to Zernike functions provides a directly readable prediction as regards the image properties of optical elements. The methods according to the invention can of course also be carried out by factorization into other orthogonal function sets, for example Legendre polynomials.

BRIEF DESCRIPTION OF THE DRAWINGS

Embodiments of the invention are illustrated in more detail hereinafter with the aid of the drawings, in which:

FIG. 2 is a flow diagram for the optimization of the projection objective lens system of FIG. 1;

FIG. 3 is a side view of four diagrammatically represented relative positions of optical elements of an alternative projection objective lens system;

FIG. 4 is a flow diagram for the optimization of the projection objective lens system of FIG. 3;

FIG. 7 is an alternative flow diagram for optimizing the projection objective lens system of FIG. 6.

DETAILED DESCRIPTION OF THE DRAWINGS

Figure 1:
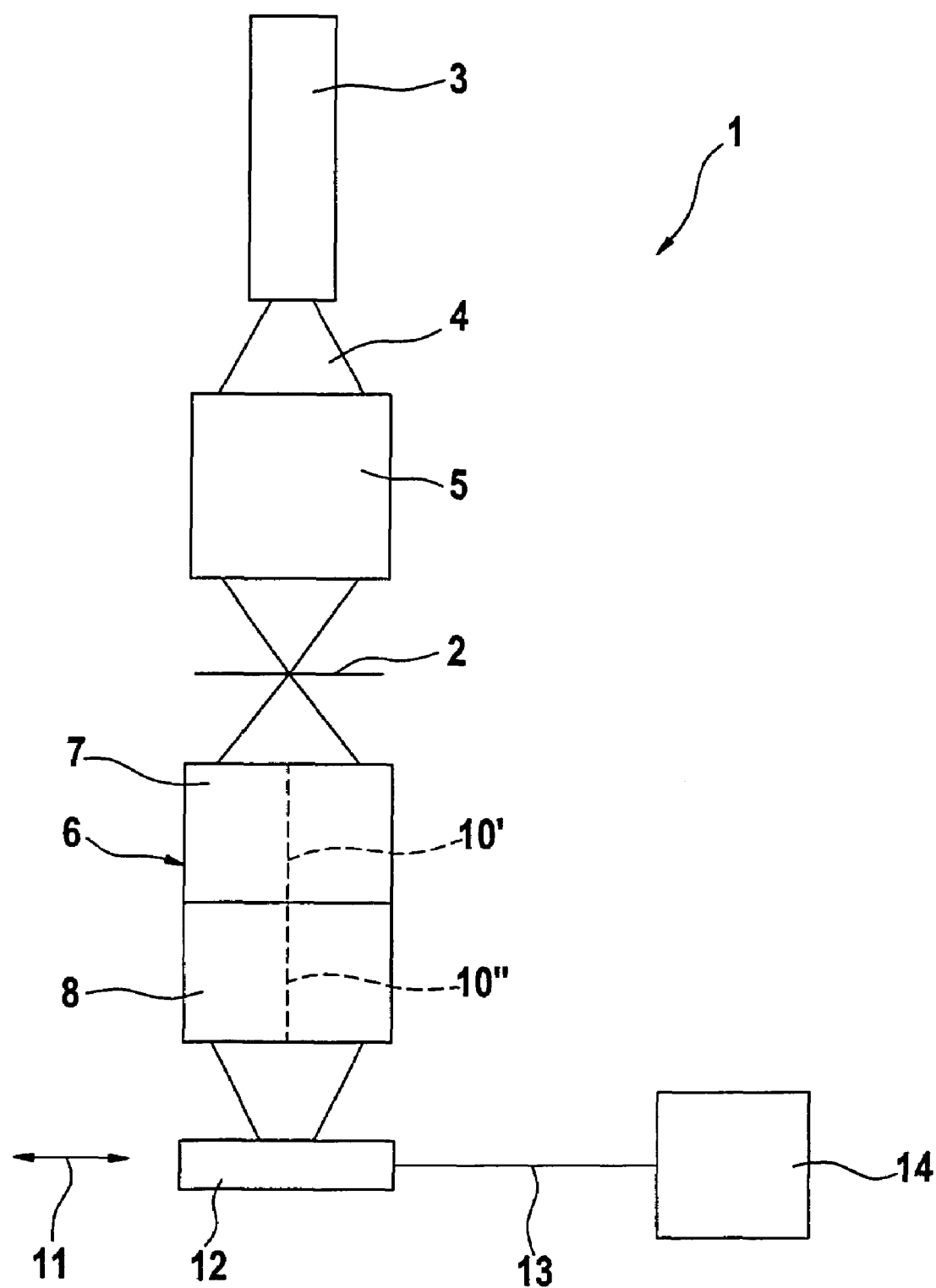
FIG. 1 is a diagrammatic side view of a projection illumination system for microlithography using a projection objective lens system that can be optimized according to the invention.

While this invention is susceptible of embodiment in many different forms, there is shown in the drawings and will be described in detail, one specific embodiment with the understanding that the present disclosure is to be considered as an exemplification of the principles of the invention and is not intended to limit the invention to the embodiment illustrated.

A projection illumination system diagrammatically illustrated in FIG. 1 and denoted overall by the reference numeral 1 serves for the transfer of structures contained on a mask 2 to a wafer (not shown).

The projection illumination system 1 comprises as light source a UV laser 3, for example an ArF laser or a F2 laser. Projection light 4 emitted by the laser 3 passes through an illumination optics system 5 and illuminates the mask 2. An image of the thereby illuminated structures on the mask 2 is formed on the wafer by a projection objective lens system 6.

The projection objective lens system 6 has two optical elements 7, 8 moveable relative to one another. The relative movement is effected by rotation of the upper optical element 7 in FIG. 1 about the optical axis of the projection objective lens system 6. The optical elements 7, 8 shown diagrammatically in FIG. 1 may comprise groups of optical components, for example lenses, or also individual optical components.

In the drawing the optical elements that can be rotated relative to one another, for example the optical elements 7, 8 of the projection objective lens system 6 in FIG. 1 are provided with a circumferential marking 10 (shown by the dotted line) running parallel to the optical axis, illustrating an instantaneous rotational position of the respective optical element.

The rotation of the optical element 7 is effected by loosening the securement of the optical element 7 within the projection objective lens system 6 and manually rotating the element. The optical element 7 is then secured once more in the projection objective lens system 6.

In the diagrammatic representation of FIG. 1 the optical element 8 denotes all optical elements that contribute to the image defect of the projection objective lens system 6 and that are stationary, i.e. do not move during a rotation of the optical element 7.

In the region of the image plane of the projection objective lens system 6 an air image measuring device 12 is provided that can be displaced perpendicularly to the optical axis of the lens system (see double arrow 11). This measures the intensity of the projection light 4 in the region of the image plane of the projection objective lens system 6. The intensity measurement may, as illustrated in FIG. 1, be carried out directly in the region of the image plane or via an intermediate image of the image plane.

The air image measuring device 12 communicates via a data line 13 with a computer 14. The air image measuring device 12 and the computer 14 together form an optimization device for optimizing the image properties of the projection objective lens system 6. This may be a fixed component of the projection illumination system 1. Alternatively it is possible for the whole optimization device or parts thereof to be connected as required to the projection objective lens system during the projection operation of the projection illumination system 1, but separately from the latter.

A method for optimizing the image properties of the projection objective lens system 6 is described hereinafter with the aid of the flow diagram of FIG. 2.

Starting from a first position of the projection objective lens system 6, in which as in FIG. 1 the circumferential markings 10 of the optical elements 7, 8 coincide with one another and are hereinafter identified as the initial position 18, the wave front of the projection light 4 is measured in a measurement step 19 with the aid of the air image measuring device 12. This is a direct measure of the overall image defect of the projection objective lens system 6, consisting of the image defects of the optical elements 7, 8.

The measurement data recorded by the air image measuring device 12 are transmitted via the data line 13 to the computer 14 (see FIG. 1).

In a following calculation step 20 the measured overall image defect is represented as a linear combination of the base functions of an orthogonal function set. The scalar and vector Zernike functions Z serve as orthogonal function set, depending on the field co-ordinates in the plane in which the measurement is performed by the air image measuring device 12.

The factorization of the scalar image defect component V of the overall image defect into scalar Zernike functions is given hereinafter by way of example:

$$\nabla(r, \Phi) = \sum_{i=1}^{n} b^{(i)} Z^{(i)}(r, \Phi)$$

In the above, $Z^{(i)}$ are the various scalar Zernike functions and $b^{(i)}$ are the associated coefficients that are necessary for the correct description of the measured scalar image defect V. The coefficients $b^{(i)}$ are determined with the aid of conventional mathematical variation methods so as to provide as good a match as possible of the linear combination of the Zernike functions to the measurement data of the overall image defect. The coefficients $b^{(i)}$ obtained may be expressed as the coefficient spectrum S. The found coefficient spectrum S in the initial position 18 is hereinafter identified as $S_0$.

In principle all types of image defects that are superimposed to form the overall image defect can be described by such a linear combination as long as only sufficiently high orders i of the scalar and vector Zernike functions are included in the linear combinations. Examples of such types of image defects include image shell, which can be described by scalar fields, as well as astigmatism, coma and distortion, which can be described by vector fields.

The procedural steps that have just been described (measurement step 19, calculation step 20) are carried out in a similar manner as measurement step 21 and calculation step 22 in a new position 23 of the optical elements 7, 8 of the projection objective lens system 6. The new position 23 is likewise illustrated diagrammatically in FIG. 2. Here the optical element 7 is, compared to the optical element 8, rotated by an angle of rotation α1 so that the circumferential marking 10' is shifted to the right in FIG. 2 compared to the aligned position in the initial position 18.

The allocation of the positions 18 and 23 of the projection objective lens system 6 to the procedural steps 19, 20 and 21, 22 is illustrated in FIG. 2 by chain-dotted lines.

For the new position 23 the result of the calculation step 22 is a coefficient spectrum $S_1$ that represents the linear combination of the Zernike functions for describing the overall image defect in the new position 23.

If after the calculation step 22 the linear combinations of the Zernike functions are available for describing the overall image defects of the projection objective lens system 6 in the initial position 18 and the new position 23, the calculation of the individual image defects of the optical elements 7 and 8 is carried out in an analysis step 24.

For this it is assumed that, on account of the orthogonality of the Zernike functions, the following relationships can be adopted:

$$S_0 = S_{OE1} + S_{OE2}$$

and also:

$$S_1 = T(\alpha_1) S_{OE1} + S_{OE2}$$

In the above $S_{OE1}$ and $S_{OE2}$ denote the coefficient spectra that describe the individual image defects of the optical elements 7 (element one, E1) and 8 (element two, E2). $T(\alpha_1)$ denotes the rotation matrix that, on account of the rotation of the optical element 7 about the angle of rotation $\alpha_1$, has to be used on its coefficient spectrum $S_{OE1}$ in order to describe in the stationary spatial co-ordinates the coefficient spectrum of the rotated optical element 7.

The coefficient spectra of the optical elements 7 and 8 can be calculated directly from the last two equations given above:

$$S_{OE1} = [T(\alpha_1) - E]^{-1}(S_1 - S_0)$$

$$S_{OE2} = S_0 - S_{OE1}$$

Here, E denotes the unit matrix. The image defects of the individual optical elements 7, 8 are obtained by inserting the calculated coefficient spectra in the linear combination of the Zernike functions.

A target position of the optical element 7, in which the overall image defect of the projection objective lens system 6 is optimized, is calculated in a calculation step 25 following the analysis step 24.

In this connection, the overall coefficient spectrum $$S_{overall} = T(\alpha) S_{OE1} + S_{OE2}$$

for which the RMS value of the overall image defect or alternatively the maximum contribution of the overall image defect in the field are minimized, is sought as a function of the angle of rotation α of the optical element 7. A combination of the RMS value and the maximum contribution of the overall image defect are also suitable as optimization quantity.

In general, in order to determine a parameter (in this case the angle of rotation α) resulting in a coefficient spectrum with optimized overall image defect, any function can be used that contains the coefficient spectrum corresponding to this parameter and that represents the quality of the image. Such a function is hereinafter termed a merit function. The result of the merit function is as a rule a scalar quantity that is minimized for the optimization.

The overall coefficient spectrum is varied by altering the angle of rotation α by means of known mathematical methods until a target angle of rotation αZ is found resulting in the overall coefficient spectrum Soverall with an optimized overall image defect.

The target angle of rotation αZ calculated in the computer 14 is then printed out.

In a following control and movement step 26 the optical element 7 is then manually rotated by the target angle of rotation αZ relative to the optical element 8. The overall image defect of the projection objective lens system 6 is then optimized.

Further variants of projection illumination systems and projection objective lens systems and methods for their optimization are described hereinafter. Components and procedural steps that correspond to those that have already been described above are identified by reference numerals increased in each case by 100, and are not discussed in detail any further.

An alternative projection objective lens system 106 (see FIG. 3) comprises a total of three optical elements 130, 131, 132 rotatable about their optical axis and a stationary optical element 133. The optical elements 130 to 133 carry circumferential markings 10' to 10'''' similarly to the first described embodiment.

A method for optimizing the overall image defect of the projection objective lens system 106 is described hereinafter with the aid of FIG. 4:

Which part of the projection objective lens system 106 that is to be moved first is predetermined initially in an initialization step 140. The projection objective lens system 106 is for this purpose subdivided into a first part integral with the part to be moved and a second, stationary part. An individual drive device 134, 135, 136 or a combination of the latter may be predetermined for this purpose by means of a random function generated by a random generator. The subdivision specified in the initialization step 140 is converted into an output signal that enables the user in the course of the further procedure to move the optical elements 130 to 132 of the projection objective lens system 106 according to the subdivision specified in the initialization step 140.

Which part of the projection objective lens system 106 is moved first of all is not important for the further procedure, and this choice may therefore also be fixed beforehand (for example, first of all rotation of the uppermost optical element 130 in FIG. 3).

The overall image defect of all optical elements in the initial position of the projection objective lens system 106 is measured in a measurement step 141 using an air image measuring device (c.f. air image measuring device 12 of the embodiment according to FIG. 1). This measurement is carried out in the same way as has been described in connection with FIGS. 1 and 2 (measurement steps 19 and 21).

A coefficient spectrum S0 is determined in a calculation step 142 on the basis of the image defect measured in the measurement step 141. This is carried out in a similar way to that described in connection with the optimization method according to FIG. 2 (calculation steps 20 and 22).

The part predetermined in the initialization step 140 to be moved is then rotated by an angle of rotation $\alpha_1$ in a movement step 143. The optical elements 130 to 133 of the projection objective lens system 106 are then located in a new measurement position.

The overall image defect of the projection objective lens system 106 in the new measurement position is remeasured in a further measurement step 144.

The image defect determined in the measurement step 144 is also converted in a subsequent calculation step 145 into a coefficient spectrum $S_1$.

A calculation of the image defects of the moved part and of the stationary part of the projection objective lens system 106 is then performed in an analysis step 146. This takes place in a similar way as already described in connection with FIG. 2 (analysis step 24). The moved part of the projection objective lens system 106 corresponds in this connection to the optical element 7 in FIG. 2, and the stationary part of the projection objective lens system 106 corresponds to the optical element 8. Instead of the coefficient spectra $S_{OE1}$ and $S_{OE2}$ of the optical elements 7 and 8 obtained in the method according to FIG. 2, coefficient spectra SBT for the moved part as well as SST for the stationary part of the projection objective lens system 106 are obtained in the method according to FIG. 4.

In a similar way as in the calculation step 25 of the method according to FIG. 2, a target angle of rotation $\alpha Z$ by which the moved part of the projection objective lens system 106 is to be rotated is calculated by means of a merit function in a calculation step 147, thereby minimizing the image defect of the projection objective lens system 106 in accordance with the merit function. The result of the calculation step 147 is a target position of the projection objective lens system 106 as well as the overall coefficient spectrum of the calculated overall image defect in the target position. The target position at this point in time has still not actually been adjusted but exists simply as an imaginary calculation result.

Up to the initial initialization step 140, the procedural steps 141 to 147 of the optimization method according to FIG. 4 thus correspond to the procedural steps 19 to 22 as well as 24 and 25 of the optimization method according to FIG. 2. In addition, with the method according to FIG. 4 the movement step 143 that corresponds in the method according to FIG. 2 to the difference between the initial position 18 and the new measurement position 23 is also explicitly stated.

In a comparison step 150 the overall image defect calculated in the calculation step 147 is compared with a preset value (target) that has been stored in a memory.

If the comparison step 150 shows that the overall image defect is less than the preset value, a corresponding movement takes place in a movement step 148 so that the moved part of the projection objective lens system 106 is brought into the target position.

In the target position of the projection objective lens system 106 adjusted in the movement step 148, the overall image defect of the projection objective lens system 106 is remeasured using the wave front sensor. This takes place in a measurement step 149.

In a further comparison step 151 the overall image defect measured in the measurement step 149 is compared with the preset value (target). By means of this check of the measurement value it is ensured that the preset target value is in fact also maintained. Variations between the calculated and measured overall image defects may be caused for example by influencing quantities that have been taken into account only approximately or indeed not at all in the calculation of the overall image defect.

When the comparison step 151 shows that the measured overall image defect too is smaller than the preset value, the overall image defect measured in the measurement step 149 is displayed after the comparison step 151 in an output step 152. The optimization procedure is in this case complete.

If the comparison in the comparison step 150 or in the comparison step 151 shows that the overall image defect calculated in the calculation step 141 or determined in the measurement step 149 is greater than the preset value, then it is determined in a further comparison step 153 whether parts of the projection objective lens system 106 are still present that can still be subdivided into parts that have not yet been moved relative to one another. This comparison is performed by comparing the previous movement of the optical elements 130 to 132 of the projection objective lens system 106, which was initiated in the movement step 143, with the principal movement possibilities of the optical elements 130 to 132 of the projection objective lens system 106. This takes place by evaluating corresponding movement data that are input by the user into an input terminal (not shown) of the computer 14 during the course of the manual rotation of the elements 130 to 132 performed prior to this, and are used as comparison values.

The projection objective lens system 106 comprising four optical elements 130-133 movable with respect to one another can, after a first movement of a movable part with respect to a stationary part, obviously still be split up into further parts movable with respect to one another (see in this connection FIG. 3). If for example in the movement step 143 the optical element 130 alone is rotated, then a stationary part of the projection objective lens system 106 together with the optical elements 130 to 133 still exists. This part can be subdivided for example into a movable part together with the optical element 131, which is moved together with the optical elements 132, 133 relative to a stationary part.

After a movement step 143 carried out only once, several potential further possibilities of subdivision into a next part to be moved and into a next stationary part thus still exist in the projection objective lens system 106.

This result of the comparison step 153 leads therefore to a determination step 154 in which, with the aid of the previous rotational procedures, it is determined whether there are several possibilities of further subdividing the parts of the projection objective lens system 1 already rotated relative to one another into parts to be rotated relative to one another. This is the case for example if, during the first movement step 143, the optical elements 130, 131 are rotated jointly by an angle of rotation $\alpha$ relative to the optical elements 132, 133 that remain stationary. In this case a moved part of the projection objective lens system 106 is present that comprises the optical elements 130, 131 and may thus be subdivided still further, since the optical elements 130, 131 are for their part movable with respect to one another. Also, the initially stationary part together with the optical elements 132, 133 is present, which can likewise be subdivided still further since the optical element 132 can be rotated relative to the optical element 133.

In such a case involving several possibilities of further subdivision, that part that can still be subdivided, whose image defect provides the greatest contribution to the overall image defect that was determined in the measurement step 149, is determined in the determination step 154 on the basis of the result of the analysis step 146.

The subdivision determined in the determination step 154 is converted into an output signal in a subdivision step 155. This enables the user during the further procedure to move the optical elements 130 to 132 of the projection objective lens system 106 according to the subdivision determined in the determination step 154.

The procedure is therefore adopted again in the movement step 143. As a result the procedural steps 143 to 147, 150 are performed again as described above, whereby in the movement step 143 the movement of the part of the projection objective lens system 106 to be moved takes place according to the subdivision predetermined in the determination step 154 and converted in the subdivision step 155.

The calculation of the target position of the projection objective lens system 106 (calculation step 147) is in the second repetition of the procedure no longer aimed only at the determination of a target angle of rotation, but at determining the two target angles of rotation since in this second repetition a total of three parts moved relative to one another already exists within the projection objective lens system 106, whose positions are uniquely defined by two angles of rotation.

In principle it is possible in an alternative variant of the optimization process to omit the comparison step 150 and to carry out, after each analysis in the analysis step 146 and subsequent calculation of the target position in the calculation step 147, a real rotation of the projection objective lens system 106 to the last calculated target position and to measure the overall image defect present in this position configuration. Such a procedure is however as a rule more complicated than the variant described above, in which a movement of the projection objective lens system to the target position takes place only if the calculated overall image defect is less than the preset value.

One possible way of determining the target position according to the calculation step 147 is based on principles of statistical mechanics. This calculation method relies on the observation that a physical multiparticle system in thermal equilibrium assumes a minimum value of the free energy. The search for the global minimum of a merit function (hereinafter abbreviated to MF), which depends on a plurality of parameters, i.e. the angles of rotation of the various possible rotations of the optical elements 130 to 133 movable with respect to one another, is carried out in a similar manner to the search for the global minimum of the free energy of a multiparticle system. Examples of further possible calculation methods are known genetic algorithms and evolution strategies. These calculation methods are known to the person skilled in the art and are described for example in the following publications: Press, Teukolsky, Vetterling, Flannery, "Numerical Recipes in C—The art of scientific computing", second edition, Cambridge University Press, 1992; E. L. Lawler et al. (Eds.), "The traveling salesman problem. A guided tour of combinatorial optimization", Wiley, Chichester 1985; M Jünger, G. Reinelt, G. Rinaldini, "The traveling salesman problem" in "Annotated bibliographies in conbinatorial optimization", Mauro Dell' Amico (Eds.), Wiley, Chichester, 199, 1997; D. Applegate et al., "On the solution of traveling salesman problems" in Documenta Mathematica, Extra Volume, Proceedings of the ICM 98, 645, 1998; R. E. Burkard, "Well solvable special cases of the traveling salesman problem: A survey" in SLAM Review, Vol. 40, 496, 1998; Tagungsberichte [Conference Report] in "The Seventh International Conference on Genetic Algorithms", Jul. 19-23, 1997, Michigan State University, East Lansing, Mich.

The determination of the target position is carried out by presetting in an imaginary way specific position configurations of the projection objective lens system, i.e. without in fact actually achieving these position configurations, and then evaluating the merit function associated in each case with these position configurations. As explained above, this evaluation is possible since the individual contributions of the optical elements of the projection objective lens system imaginarily rotated relative to one another are known. Depending on the calculation it is decided whether to accept a new position configuration, achieved by imaginary rotation of at least one optical element by at least a preset angle of rotation, as a new, better position configuration with which to continue the calculation, or whether to continue the calculation with the old position configuration.

The method for calculating a target position of the moved part or parts of the projection objective lens system 106 enables a target position to be rapidly found without having to try all possible position variants of the moved part or parts. The calculation procedure may be designed so as to ensure that an already reached minimum of the overall image defect is disregarded and that adjacent minima, i.e. position regions in which the overall image defect is reduced but is still however remote from a global minimum, can also be disregarded.

As an alternative to the statistical calculation procedure discussed above, it is of course possible for the determination of a target position to investigate specifically by using a computer all possible position configurations that the projection objective lens system 106 can adopt, in order thereby to determine the optimal position configuration of the moved part or parts of the said projection objective lens system 106. Such a predetermination of all possible position combinations of the moved part or parts of the projection objective lens system 106 is suitable if the number of the moved part or parts is still small.

FIG. 3 shows one possible sequence of subdivisions of the projection objective lens system 106 according to the method of FIG. 4. In FIG. 3*a* the optical elements 130 to 133 of the projection objective lens system 106 are in the initial position. In this case all the circumferential markings 10' to 10'''' coincide.

In the initialization step 140 the projection objective lens system 106 is subdivided into a first part to be moved, namely the optical element 130, and into a second, stationary part, namely the optical elements 131 to 133. For the optical element 130 the calculated target position, which is shown in FIG. 3*b*, is then found by carrying out the procedural steps 141 to 147 of FIG. 4. The circumferential marking 10' of the optical element 130 is in this connection shifted a bit further to the right in FIG. 3*b*.

This target position is not actually reached. Instead, within the scope of the method according to FIG. 4 only the comparison steps 150 and optionally 151 are carried out. Within the scope of the description of FIG. 3 it is assumed that, in these comparison steps relating to FIGS. 3a to 3c, it was found that the overall image defect in the target position is greater than the preset value.

In the subsequent subdivision step 155 that is therefore necessary, the still subdivisible part of the projection objective lens system 106, namely the optical elements 131 to 133 that have not yet been moved relative to one another, is in turn subdivided into a first part to be moved, namely the optical element 131, and into a second, stationary part, namely the optical elements 132, 133.

After carrying out the procedural steps 143 to 147 a new calculated target position is obtained for the optical elements of the projection objective lens system 106, which is illustrated in FIG. 3c. Here the optical elements 130 and 131 have been rotated from the initial position shown in FIG. 3a. The optical element 130 adopts in the new target position (c.f. FIG. 3c) a position that is different to the initial position (c.f. FIG. 3a) and to the position configuration in which the optical element 130 alone was optimized for the rotation (c.f. FIG. 3b). This is on account of the newly introduced degree of freedom in FIG. 3c, namely the rotatability of the optical element 131.

Following on the subdivision step 155 carried out for the second time, the subdivisible part of the projection objective lens system 106 that still remains, namely the optical elements 132 and 133 (c.f. FIG. 3c), is subdivided into a first part to be moved, namely the optical element 132, and into a second, stationary part, namely the optical element 133. The procedural steps 143 to 147 are then carried out once more. A calculated target position is obtained, which is illustrated in FIG. 3d. Similarly to what was said in connection with FIG. 3c, it is true in this case also that the positions of the optical elements 130, 131 do not have to coincide with their previous positions (c.f. FIG. 3c). This may however occur accidentally, as shown in FIG. 3.

Three optical elements 130, 131, 132 rotatable independently of one another are involved in the calculation of the target position of FIG. 3d. If each of these optical elements 130 to 132 can be adjusted with a position step width of 1°, there are 360 possible positions for each of the optical elements 130 to 132; a total of 3604, i.e. more than 1.6×1010 possible position combinations exist for the projection objective lens system 106. This shows that already with four optical elements movable with respect to one another and a position step width of 1°, it is no longer physically or computationally possible to control all possible position combinations in order to find the global optimum. In this case one of the statistical methods discussed above leads much more quickly to a target position in which, within the scope of the positions that are possible due to the permitted degrees of freedom of movement, the overall image defect is reduced to a value in the vicinity of the optimum value.

In the method according to FIG. 4 the projection objective lens system 106 is subdivided into one or more parts to be moved and into a stationary part until the overall image defect falls below a preset value. Alternatively it is also possible in each case, i.e. without comparison with a preset value of an overall image defect, to carry out all possible subdivisions of the projection objective lens system 106. In this case the comparison step 150 is skipped. The procedure then ends when a complete subdivision of the projection objective lens system 106 into all optical elements 130 to 133 has been carried out and the target position (control step 148) has been reached for this complete subdivision. In this target position the smallest value of the overall image defect for the given system is then reached.

Figure 5:
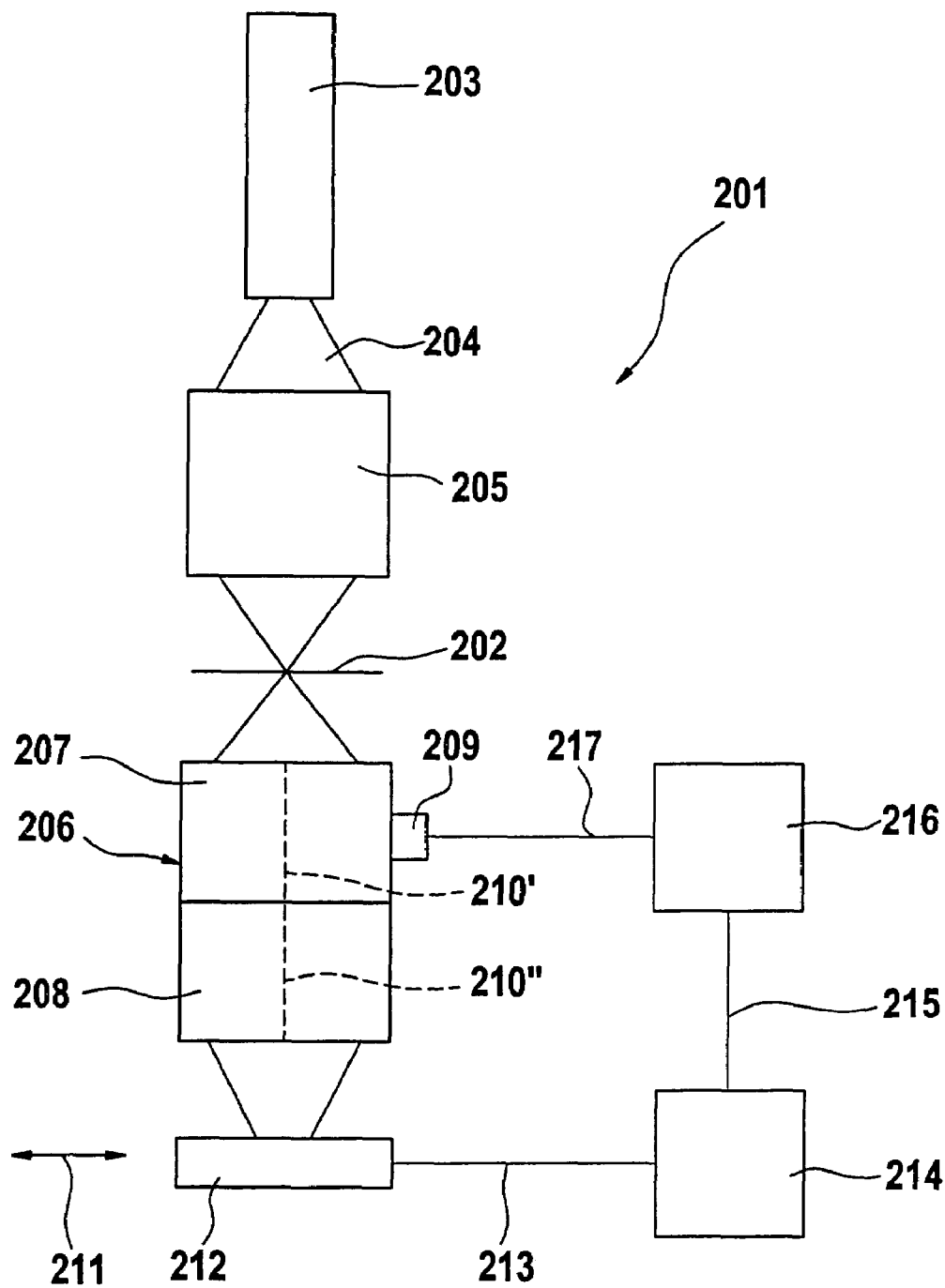
FIG. 5 shows an alternative projection illumination system.

In an alternative embodiment of the projection illumination system illustrated in FIG. 5, which is identified by the reference numeral 201, the rotation of the optical element 207 is performed by a drive 209, for example by an electric motor.

The computer 214 evaluating the overall image defect of the projection objective lens system 206 is in this embodiment connected via a signal line 215 to a control device 216 that controls the drive 209 via a control line 217. In this embodiment the drive 209, the air image measuring device 212, the computer 214 and the control device 216 together form an optimization device for optimizing the image properties of the projection objective lens system 206.

The method according to FIG. 2 can be used correspondingly in the projection objective lens system 201. In the following movement step 26, instead of a manual rotation the drive device 209 is controlled via the control device 216 so that the optical element 207 is rotated by the target angle of rotation αZ relative to the optical element 208.

Figure 6:
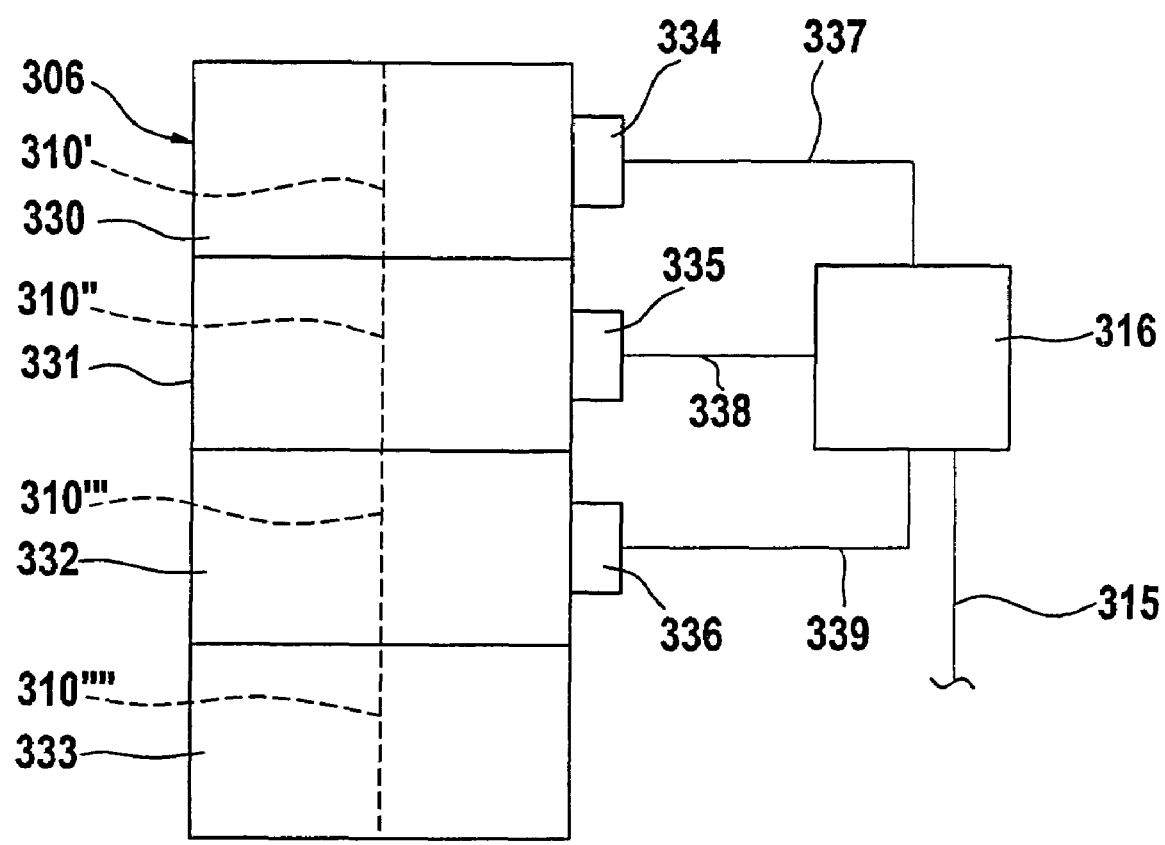
FIG. 6 is a diagrammatic side view of an alternative projection objective lens system that can be optimized according to the invention.

In a further variant of a projection objective lens system illustrated in FIG. 6, which is identified overall by the reference numeral 306, the uppermost three optical elements 330 to 332 in FIG. 6 can be rotated by means of drive devices 334, 335 and 336 about the optical axis of the projection objective lens system 306. For this, the drive devices 334 to 336 are connected via control lines 337, 338 and 339 to a control device 316. The control device 316 is connected via a signal line 315 to a computer, not shown in FIG. 6 (c.f. in this connection the optimization device according to FIG. 5).

The optimization procedure according to FIG. 4 can be used correspondingly in the projection objective lens system according to FIG. 6. This corresponding procedure is illustrated in FIG. 7 and is described hereinafter only insofar as it differs from the method according to FIG. 7. The subdivision determined in the initialization step 340 in the method according to FIG. 7 is for this purpose converted into a data signal that permits the control device 316 in the further procedure to move the optical elements 330 to 332 of the projection objective lens system 306 in the movement step 343, according to the subdivision determined in the initialization step 340.

In the movement step 348, instead of a manual rotation a corresponding control of the control device 316 is performed so that the moved part of the projection objective lens system 306 is brought into the target position.

The comparison step 353 may take place in the projection illumination system with the projection objective lens system 306 by reading out corresponding movement data that were stored in the control device 316 and that reproduce the movement history. The subdivision determined in the determination step 354 is correspondingly converted into a data signal that permits the control device 316 in the further procedure to move the optical elements 330 to 332 of the projection objective lens system 306 in the movement step 343, according to the subdivision determined in the subdivision step 354.

The measurement of the overall image defect required for the various variants of the optimization method was performed hereinbefore with the aid of an air image measurement, i.e. a position-resolved intensity measurement in the region of the plane of the image or a plane of the projection objective lens system conjugate thereto.

A measurement of the overall image defect may alternatively be performed by a known interferometry method, which provides measurement information that in the ideal case allows an exact reconstruction of the wave front.

Ambiguities may occur in air image data that prevent an unambiguous allocation of individual contributions effected by the factorization in terms of Zernike functions, to the overall image defect, since the radial orders of this factorization cannot be specified unambiguously. For example, a factorization of a "coma" type image defect in terms of Zernike functions includes radial contributions of the Zernike functions Z7 and Z14, in which connection with an air image measurement it cannot as a rule be decided whether a measured radial dependence of the overall image defect was caused by the contribution of the Zernike function Z7 or by the contribution of the Zernike function Z14.

Instead of obtaining wave front data by means of interferometry, sufficient wave front information for the description of the radial pattern of the overall image defect can also be obtained from air image measurements at various illumination geometries, i.e. so-called illumination settings. This is possible with a projection illumination system that is modified only slightly compared to those illustrated in FIGS. 1 and 5:

For this purpose an aperture diaphragm with a variable aperture is incorporated in the region of the illumination optics 5, 205 of the projection illumination system 1, 201. The overall image defect is then measured with different forms of the aperture, for example at different diameters of the illumination bundle 4, 204. From these measurements conclusions can be drawn regarding the various radial wave front orders and thus also the various radial orders in the description of the overall image defect, that are sufficiently accurate for the aforedescribed optimization methods.

As coefficients b that make up the coefficient spectrum S, there may also be used for this factorization the coefficients b that are obtained directly from the matching of a linear combination of Zernike functions to the image defect data measured with the air image measuring device. However, corresponding to the above discussion these coefficients as a rule consist of a mixture of various radial wave front orders k, which is why direct knowledge of individual radial orders is generally not available. If however such radial wave front orders k are to be individually optimized per se in each case, separate knowledge of these orders is necessary. In this case, instead of the coefficient spectrum S described above, a coefficient spectrum is used that is composed of weighted coefficients $\delta_b$, which can be obtained according to the following equation from the coefficients bil that belong to various (1 to L) illumination settings of the illumination optics of the projection illumination system:

$$\delta b_i(k) = \sum_{l=1}^{L} g^l(k) b_i^l$$

The difference weights $g^l(k)$ are in this connection chosen so that the coefficients δb directly reproduce the coefficient spectrum for a radial wave front order k.

The foregoing description merely explains and illustrates the invention and the invention is not limited thereto except insofar as the appended claims are so limited, as those skilled in the art who have the disclosure before them will be able to make modifications without departing from the scope of the invention.

What is claimed is:

1. A measurement system for determining an image defect of at least one of at least two optical elements of an optical system, comprising:
    a) measuring means for measuring
        a first image defect of the optical system in a first relative position of the at least two optical elements and
        a second image defect of the optical system in a second relative position of the at least two optical elements, said second relative position being distinct from the first relative position, and
    b) computing means that
        represent the first image defect as a first linear combination of base functions of an orthogonal function set,
        represent the second image defect as a second linear combination of the base functions of the orthogonal function set and
        calculate the image defect of at least one of the at least two optical elements using the first linear combination and the second linear combination.

2. The measurement system of claim 1, comprising driving means for changing the relative position of the at least two optical elements.

3. The measurement system of claim 2, wherein the driving means are configured to rotate at least one of the at least two optical elements about an optical axis of the optical system.

4. The measurement system of claim 1, wherein the measuring means use air image data for measuring the first and the second image defect.

5. The measurement system of claim 1, wherein the Zernike functions are chosen as orthogonal function set.

6. The measurement system of claim 1, wherein one of the at least two optical elements is stationary.

7. A projection exposure apparatus, comprising the measurement system of claim 1, wherein the optical system is an objective lens system.

8. The apparatus of claim 7, wherein the measuring means measure wave front data of an imaging light bundle at the image side of the projection objective lens system.

9. A correction system for reducing an image defect of an optical system, wherein the optical system comprises at least two optical elements, said correction system comprising:
    a) measuring means for measuring
        a first image defect of the optical system in a first relative position of the at least two optical elements and
        a second image defect of the optical system in a second relative position of the at least two optical elements, said second relative relating being distinct from the first relative position, and
    b) computing means that
        represent the first image defect as a first linear combination of base functions of an orthogonal function set,
        represent the second measured image defect as a second linear combination of the base functions of the orthogonal function set and
        calculate a target position for the at least two optical elements based on the first linear combination and the second linear combination so as to reduce the image defect.

10. The correction system of claim 9, comprising driving means for changing the relative position of the at least two optical elements.

11. The correction system of claim 10, wherein the driving means are configured to rotate at least one of the at least two optical elements about an optical axis of the optical system.

12. The correction system of claim 9, wherein the measuring means use air image data for measuring the first and the second image defect.

13. The correction system of claim 9, wherein one of the at least two optical elements is stationary.

14. The correction system of claim 9, wherein the Zernike functions are chosen as orthogonal function set.

15. A projection exposure apparatus, comprising the measurement system of claim 9, wherein the optical system is an objective lens system.

16. The apparatus of claim 15, wherein the measuring means measure wave front data of an imaging light bundle at the image side of the projection objective lens system.

17. A method for determining a first imaging defect of an optical system comprising at least two optical elements whose relative position with respect to each other can be changed, the method comprising the following steps:
 a) determining a second imaging defect for a first relative position of the at least two optical elements;
 b) determining a third imaging defect for a first relative position of the at least two optical elements;
 c) determining the first imaging defect by comparing the first imaging defect to the third imaging defect.

18. A determining system for determining image defects of an optical system, wherein the optical system comprises at least two optical elements, said determining system comprising:
 a) means for determining a first imaging defect for a first relative position of the at least two optical elements;
 b) means for determining a second imaging defect for a second relative position of the at least two optical elements;
 c) means for determining a third imaging defect by comparing the first imaging defect to the third imaging defect.

* * * * *